(12) United States Patent
Jeong et al.

(10) Patent No.: US 9,072,168 B2
(45) Date of Patent: Jun. 30, 2015

(54) ELECTROMAGNETIC INTERFERENCE BLOCKING DEVICE AND CIRCUIT ASSEMBLY INCLUDING THE SAME

(71) Applicant: Avago Technologies General IP (Singapore) Pte. Ltd., Singapore (SG)

(72) Inventors: Jin Jeong, Kyunggi province (KR); William Lam, Penang (MY); Chris Chung, Seoul (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 174 days.

(21) Appl. No.: 13/897,124

(22) Filed: May 17, 2013

(65) Prior Publication Data

US 2014/0340863 A1    Nov. 20, 2014

(51) Int. Cl.
*H05K 1/02*    (2006.01)
*H05K 9/00*    (2006.01)

(52) U.S. Cl.
CPC .............. *H05K 9/0032* (2013.01); *H05K 1/023* (2013.01); *H05K 1/0216* (2013.01)

(58) Field of Classification Search
CPC ... H05K 1/023; H05K 1/0216; H05K 9/0022; H05K 9/0032; H05K 9/0024; H05K 9/0026; H05K 9/0028
See application file for complete search history.

(56) References Cited

U.S. PATENT DOCUMENTS

| | | | | |
|---|---|---|---|---|
| 6,366,473 | B1 * | 4/2002 | Sauer | 361/818 |
| 7,224,249 | B2 * | 5/2007 | van Quach et al. | 333/238 |
| 7,659,790 | B2 | 2/2010 | Shaul et al. | |
| 8,154,364 | B2 * | 4/2012 | Ohhira | 333/238 |

OTHER PUBLICATIONS

Iulian Rosu, "Microstrip, Stripline, and CPW Design", YO3DAC / VA3IUL, 2012, http://www.qsl.net/va3iul.
Stephen C. Thierauf, "High-Speed Circuit Board Signal Integrity", Artech House, Inc., 2004, pp. 1-263.
Myung-Kul Kim, "Crosstalk control for microstrip circuits on PCBs at microwave frequencies", IEEE International Symposium on Electromagnetic Compatibility, 1995, pp. 1-2.
Myung-Kul Kim, "Crosstalk control for microstrip circuits on PCBs at microwave frequencies", IEEE International Symposium on Electromagnetic Compatibility, 1995, pp. 459-464.

* cited by examiner

*Primary Examiner* — Lisa Lea Edmonds
*Assistant Examiner* — Keith Depew

(57) ABSTRACT

An electromagnetic interference blocking device is provided for blocking electromagnetic interference between transmission lines formed on a surface of a circuit board. The electromagnetic interference blocking device includes a body configured to be inserted into a slot formed in the surface of the circuit board between the transmission lines, the body including a bottom portion having a comb shape insertable within the slot.

20 Claims, 5 Drawing Sheets

ELECTROMAGNETIC INTERFERENCE BLOCKING DEVICE AND CIRCUIT ASSEMBLY INCLUDING THE SAME

BACKGROUND

The present disclosure relates to an electromagnetic interference blocking device and an assembly including same. More particularly, the present disclosure relates to an electromagnetic interference blocking device for blocking electromagnetic interferences among transmission lines formed on a circuit board, and an assembly having the device mounted on a circuit board.

When a current flows through a signal line, an electromagnetic field may be generated. The electromagnetic field, in turn, may generate an induced current/voltage in a neighboring signal line, which degrades performance of the neighboring signal line. Since the strength of the induced current/voltage in the neighboring signal line is proportional to the frequency of current/voltage applied in the signal line, performance degradation due to the induced current/voltage hardly occurs among signal lines in a DC circuit. However, in a circuit using a high frequency signal, such as a radio frequency (RF) signal, the impact of the induced current/voltage on performance of a neighboring signal line may become pronounced.

The above phenomenon, referred to as electromagnetic coupling, includes inductive coupling and capacitive coupling. The induced voltage ($V_{noise}$) and the induced current ($I_{noise}$) may be determined from Equations (1) and (2), where $L_m$ and $C_m$ represent mutual inductance and mutual capacitance, respectively:

$$V_{noise} = L_m \frac{dI}{dt} \quad (1)$$

$$I_{noise} = C_m \frac{dV}{dt} \quad (2)$$

As can be seen from Equations (1) and (2), the more frequently changes occur in current/voltage (i.e., the higher the frequency of current/voltage), the stronger the induced voltage/current becomes. However, the strength of the induced voltage/current cannot be controlled by simply changing the frequency of the voltage/current. This is particularly true in communication device circuitry, because the frequency range is determined based on bandwidth to be used and/or use of the entire circuitry. For example, most cellular phones operate in ultra high frequency (UHF) band ranging from 300 MHz to 3 GHz, which cannot be changed. Accordingly, the induced voltage/current can be reduced only by reducing the mutual inductance $L_m$ and the mutual capacitance $C_m$.

For example, the mutual inductance and/or the mutual capacitance may be reduced by increasing the distance between the signal line and the neighboring signal line. However, this results in increasing the size of the circuitry, and therefore is generally not a desirable approach.

In an effort to reduce the electromagnetic coupling without increasing the size of the circuitry, mounting an electromagnetic shield between neighboring signal lines on a printed circuit board (PCB) for isolating the signal lines from each other has been proposed. However, such electromagnetic shield has a drawback with respect to mass-production of circuitry because an additional process, such as soldering or welding, is necessary for mounting the electromagnetic shield on the PCB. Furthermore, it would be difficult to detach the mounted electromagnetic shield from the PCB, for example, in order to rearrange positioning of the electromagnetic shield and/or circuitry.

BRIEF DESCRIPTION OF THE DRAWINGS

The example embodiments are best understood from the following detailed description when read with the accompanying drawing figures. The various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
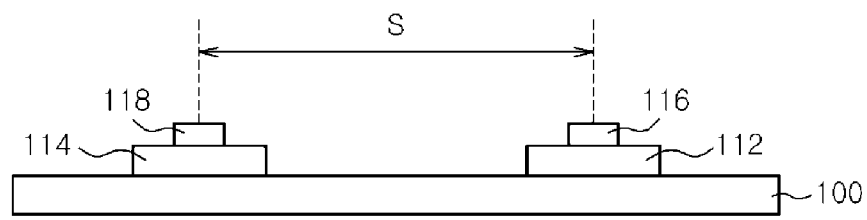
FIG. 1 is a cross-sectional view of a conventional circuit board with transmission lines.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "electromagnetic interference" as used herein, means voltage or current in a transmission line that is induced by voltage or current in another transmission line, or noise caused by such induced voltage or current.

FIG. 1 is a cross-sectional view of a conventional circuit assembly including a circuit board with transmission lines. A circuit board 100 has transmission lines 112 and 114 on its surface, which are made of conductive material and formed by etching or printing processes. The circuit board 100 may be a printed circuit board (PCB), and the transmission lines 112 and 114 may be microstrip lines, for example, formed on the top surface of the PCB. Signal pads 116 and 118 are provided on the transmission lines 112 and 114, respectively, to serve as input/output terminals for the transmission lines 112 and 114. The transmission lines 112 and 114 may be referred to as neighboring or adjacent transmission lines.

When electrical current is applied to the transmission line 112, for example, voltage or current is induced in the transmission line 114 by electromagnetic coupling, resulting in interference between the transmission lines 112 and 114. Likewise, when electrical current is applied to the transmission line 114, voltage or current is induced in the transmission line 112 by electromagnetic coupling, resulting in interference between the transmission lines 112 and 114.

Figure 2:
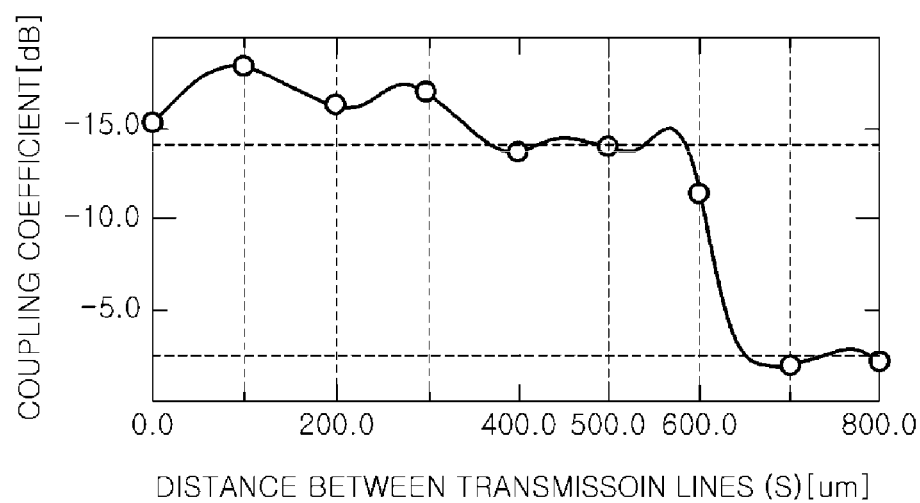
FIG. 2 is a graph plotting coupling coefficient values with respect to distances between the transmission lines of FIG. 1.

FIG. 2 is a graph plotting values of coupling coefficient values with respect to distances between the transmission lines 112 and 114 in of FIG. 1. The plot of FIG. 2 indicates results of applying a signal having a frequency of 1 GHz to one of the transmission lines 112 and 114. Frequency important performance parameters, such as an effective dielectric constant of dielectric material used for PCB and a loss tangent d, are defined for the applied signal. The coupling coefficient represents the degree of interference between two transmission lines. A smaller value (larger absolute value) of the coupling coefficient means greater degradation in performance of transmission line experiencing the interference. As shown in FIGS. 1 and 2, the greater the distance S between the transmission lines 112 and 114, the larger the value of the coupling coefficient becomes (indicating less interference). However, as mentioned above, increased distance S between the transmission lines 112 and 114 results in undesirable increased size of the circuitry.

Figure 3:
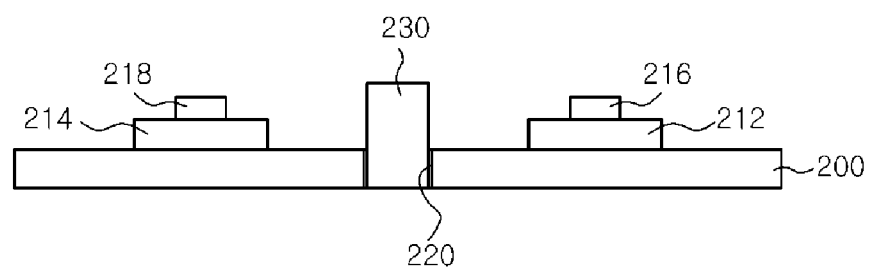
FIG. 3 is a cross-sectional view of a printed circuit board and an electromagnetic interference blocking device, in accordance with a first representative embodiment.

FIG. 3 is a cross-sectional view of a circuit assembly including a printed circuit board and an electromagnetic interference blocking device, in accordance with a first representative embodiment. According to the depicted embodiment, transmission lines 212 and 214 are formed on a top surface of a circuit board 200, and signal pads 216 and 218 are provided on the transmission lines 212 and 214, respectively. A slot 220 is formed through the top surface of the circuit board 200 between the transmission lines 212 and 214, and a portion of electromagnetic interference blocking device 230 is inserted in the slot 220, so that the electromagnetic interference blocking device 230 is mounted on the circuit board 200. In an embodiment, the electromagnetic interference blocking device 230 may be tightly fit in the slot 220, so that it may be mounted without soldering, welding, adhesive or other bonding material. The electromagnetic interference blocking device 230 is therefore easily detachable, enabling easy examination and repair of the circuit board 200 and various components. Of course, in alternative embodiments, bonding materials may be used to further secure attachment of electromagnetic interference blocking device 230 without departing from the scope of the present teachings.

In an embodiment, the electromagnetic interference blocking device 230 may be formed of a conductive material and may be connected to ground at a bottom surface of the circuit board 200. For example, the slot 220 may be formed through the circuit board 200, in which case the electromagnetic interference blocking device 230 penetrates the board 200 and is connected to ground, e.g., through a conductor formed on the bottom surface of the circuit board 200. Alternatively, the slot 220 may be formed partially through the circuit board 200 and/or be connected to ground via alternative means without departing from the scope of the present teachings. By placing the electromagnetic interference blocking device 230 between the transmission lines 212 and 214, an electromagnetic field generated by the transmission line 212, for example, is blocked so it does not affect performance of the transmission line 214, and vice versa. Further, use of the slot 220 in the board 200 facilitates mounting the electromagnetic interference blocking device 230 on the board 200 and detaching from the board 200.

Figure 4:
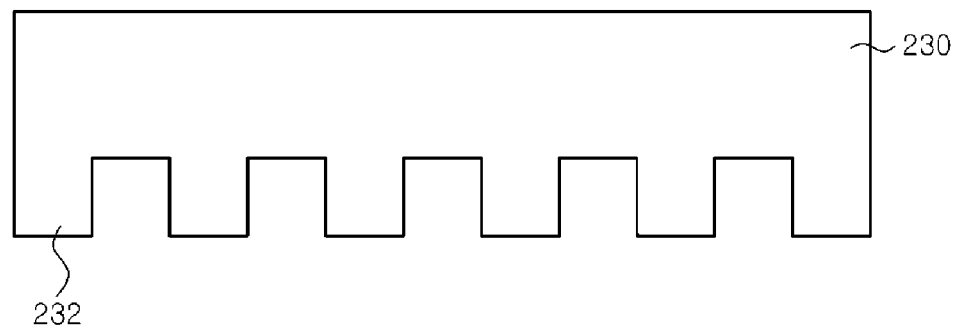
FIG. 4 is a cross-sectional view of a electromagnetic interference blocking device in accordance with a first representative embodiment.

FIG. 4 is a cross-sectional side view of the electromagnetic interference blocking device 230, in accordance with a first representative embodiment. According to the depicted embodiment, a bottom portion 232 of the electromagnetic interference blocking device 230 of FIG. 3, which is to be inserted into the slot 220, includes a comb shape. That is, thee bottom portion 232 has a series of alternating extended and receded portions, which may have the same or different corresponding widths. The comb shape of the bottom portion 232 reduces the amount of material used for manufacturing the device 230, decreasing manufacturing cost. Further, the comb shape reduces friction between an inner surface of the slot 220 and an outer surface of the bottom portion 232, reducing the possibility of alignment error while inserting the device 230 into the slot 220. For example, the device 230 may otherwise be inserted inconsistently or misaligned due to friction with the inner surface of the slot 220. This is particularly problematic in mass-production of the circuitry. However, with the comb shaped bottom portion 232, it is possible to reduce the friction, and thus reduce the potential of error during insertion.

Figure 5:
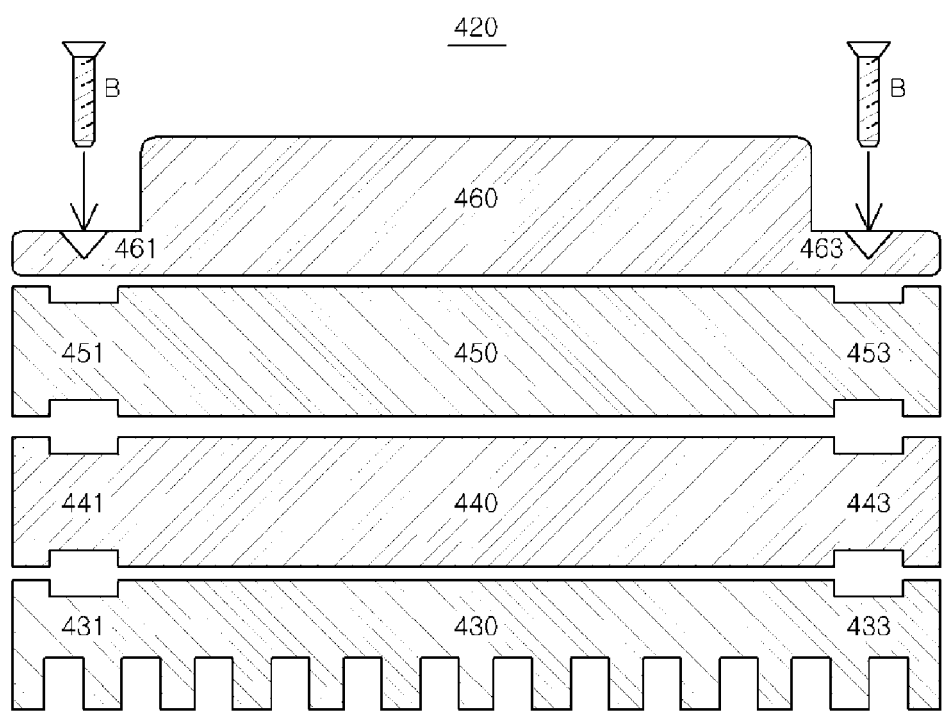
FIG. 5 is a cross-sectional view of an electromagnetic interference blocking device in accordance with a second representative embodiment.

FIG. 5 is a cross-sectional side view of an electromagnetic interference blocking device, in accordance with a second representative embodiment. In the depicted embodiment, electromagnetic interference blocking device 420 includes a body 430 which has a comb shaped bottom portion and is inserted into a slot of a circuit board (not shown), as discussed above, for mounting the electromagnetic interference blocking device 420 on the circuit board. The body 430 may be coupled to one or more of an upper guide 460, a stabilizer 450 and a fixing part 440. Although the body 430 is inserted into the slot formed through the surface of the circuit board, it is not sufficiently fixed such that the body 430 maintains its position throughout the manufacturing process of the circuitry and an electronic device including the circuitry. Coupling the body 430 to the upper guide 460, for example, facilitates maintaining the location of the body 430 throughout the manufacturing process.

The coupling of the body 430 to the upper guide 460 may be made with one or more insertable connecting devices, such as bolts B. Specifically, through holes 461 and 463 may be formed in the upper guide 460, and through holes 431 and 433 may be formed at both lateral ends of the body 430. Bolts B may be inserted through the through holes 461, 463 and 431, 433 down to the circuit board to fix the body 430 to the circuit board with the upper guide 460.

As mentioned above, the electromagnetic interference blocking device 420 may further include a fixing part 440 for fixing the body 430. The fixing part 440 may be placed and fixed between the body 430 and the upper guide 460. In particular, the fixing part 440 may have through holes 441 and 443, through which the bolts B are inserted to couple the upper guide 460, the fixing part 440 and the body 430 together. The fixing part 440, which is fixed to the body 430, may be made of rigid material to facilitate maintaining a position of the body 430 on the circuit board.

The fixing part 440 may be fixed to the upper guide 460 via a stabilizer 450, placed and fixed between the fixing part 440 and the upper guide 460. For example, through holes 451 and 453 may be formed in the stabilizer 450, and the bolts B may be inserted into the through holes 451 and 453 via the through holes 441 and 443 of the fixing part 440 and the through holes 431 and 433 of the body 430 down to the circuit board. The stabilizer 450 serves as a buffer between the upper guide 460 and the fixing part 440.

Because the body 430 is coupled to the upper guide 460 via the fixing part 440 and/or stabilizer 450, it is possible to change the distance between the upper guide 460 and the circuit board by using various combinations of the body 430, the fixing part 440 and/or the stabilizer 450 with various corresponding heights. The use of the fixing part 440 and/or the stabilizer 450 also allows for controlling the degree of blocking electromagnetic interference, and thus the performance of the circuitry, by controlling position and/or height of the electromagnetic interference blocking device 420.

Figure 6:
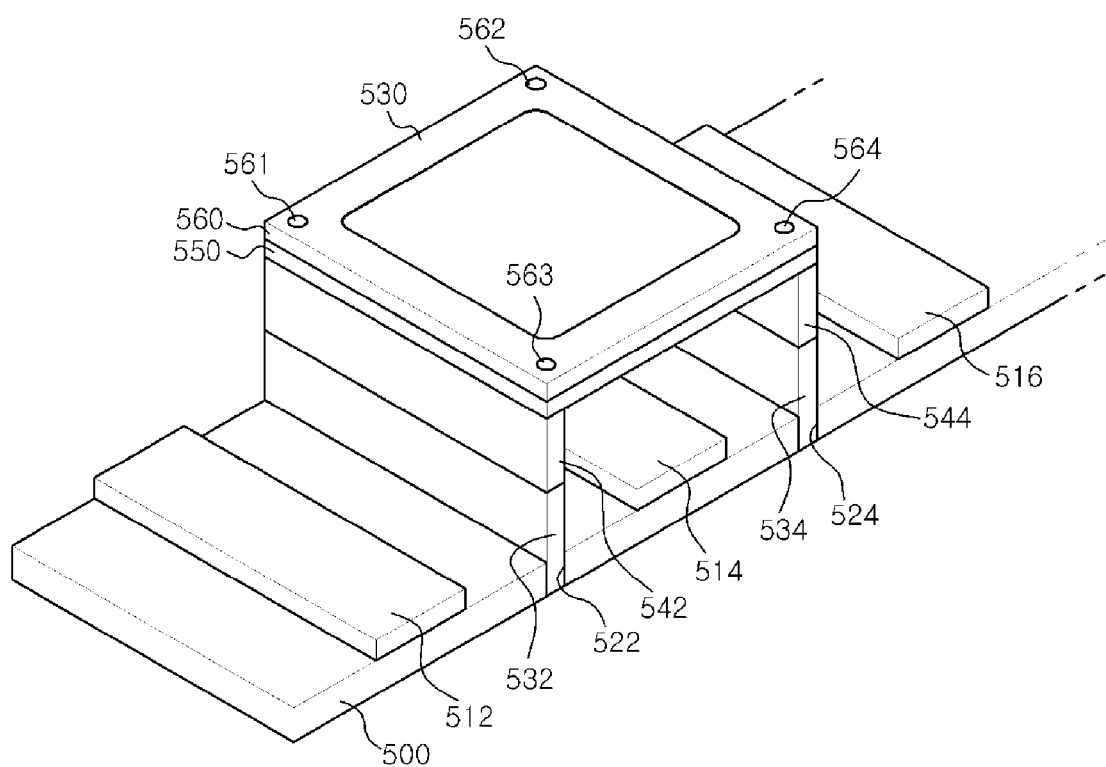
FIG. 6 is a perspective view of a printed circuit board and an electromagnetic interference blocking device in accordance with a third representative embodiment.

FIG. 6 is a perspective view of a circuit assembly including a printed circuit board and an electromagnetic interference blocking device, in accordance with a third representative embodiment. In the depicted embodiment, three transmission lines 512, 514 and 516 are formed on a circuit board 500, and electromagnetic interference blocking device 530 is placed between the lines 512 and 514 and between the lines 514 and 516. In particular, a slot 522 is formed in the circuit board 500 between the lines 512 and 514, and a slot 524 is formed in the circuit board 500 between the lines 514 and 516. The electromagnetic interference blocking device 530 includes a first body 532 inserted into the slot 522 and a second body 534 inserted into the slot 524. The electromagnetic interference blocking device 530 further includes fixing parts 542 and 544 placed on the bodies 532 and 534, respectively, a stabilizer 550 placed on the fixing parts 542 and 544, and an upper guide 560. Through holes 561 and 563 are formed to attach the body 532 to the circuit board 500 via the fixing part 542, and through holes 562 and 564 are formed to attach the body 534 to the circuit board 500 via the fixing part 544, e.g., with bolts or other fasteners. In the depicted embodiment, the upper guide 560 and the stabilizer 550 of the electromagnetic interference blocking device 530 may serve as a cover that is attached to the bodies 532 and 534 to cover the transmission line 514. However, in another example, an electromagnetic interference blocking device may have two stabilizers respectively coupled to two bodies while having an upper guide 560 fixed to two bodies. In still other examples, the upper guide 560 and/or the stabilizer 550 may be coupled to three or more bodies, or all of the bodies mounted on a circuit board.

Figure 7:
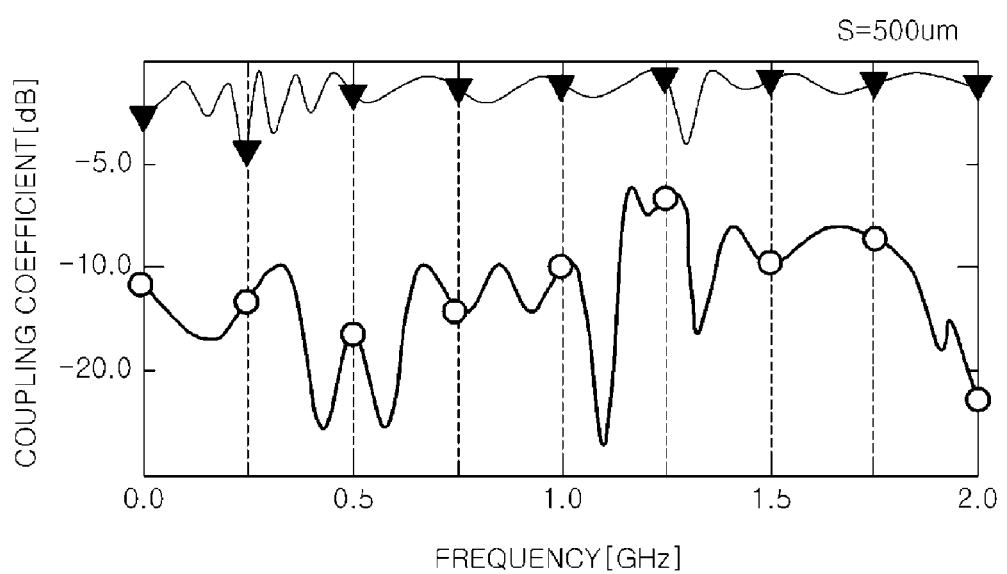
FIG. 7 is a graph plotting coupling coefficient values with respect to signal frequencies in accordance with representative embodiments.

FIG. 7 is a graph showing coupling coefficient values with respect to signal frequencies, in accordance with embodiments of the present invention, where the distance between the adjacent transmission lines is 500 μm. Referring to FIG. 7, coupling coefficients between the transmission lines with an electromagnetic interference blocking device according to various embodiments are indicated by triangles, and coupling coefficients between the transmission lines without an electromagnetic interference blocking device therebetween are indicated by circles. As can be seen from FIG. 7, the values of the coupling coefficients when the electromagnetic interference blocking device is used are greater than −5.0 dB (i.e., the absolute value thereof is less than 5.0 dB), and are consistently greater than the values of the coupling coefficients at the corresponding frequencies when the electromagnetic interference blocking device is not used, meaning that the electromagnetic interference is significantly reduced. Also, it is notable that for 1 GHz signal, a coupling coefficient of greater than about −5.0 dB is obtained with the distance between the transmission lines of 500 μm in FIG. 7, while a coupling coefficient of greater than about −5.0 dB is obtained with the distance of about 700 μm when an electromagnetic interference blocking device is not used, as shown in FIG. 2.

With the electromagnetic interference blocking device in accordance with various embodiments, it is possible to reduce electromagnetic interference without increasing the size of circuitry (which is very small), and to cause little obstruction in the manufacturing processes of the circuitry and apparatus including the circuitry. Further, employing additional elements, such as fixing parts, stabilizers and/or upper guides, enables secure mounting and easy adjustment of height of the electromagnetic interference blocking device. Also, because the electromagnetic interference blocking device may be mounted in a slot of a PCB, without soldering, welding or application of adhesive, it is easily detachable and thus the PCB can be easily examined and repaired.

Although certain specific exemplary devices have been described herein, they are intended to enable those skilled in the art to understand the invention but not to limit the scope of the invention thereto. For example, fixing parts, stabilizers, and/or upper guides need not be included in the electromagnetic interference blocking device in various embodiments. Each of the components or elements referred to herein may be implemented as a single component or as a combination of two or more components.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed is:

1. An electromagnetic interference blocking device for blocking electromagnetic interference between transmission lines formed on a surface of a circuit board, the electromagnetic interference blocking device comprising:
   a first body configured to be inserted into a slot formed in the surface of the circuit board between the transmission lines, the first body comprising a bottom portion having a comb shape insertable within the slot.

2. The electromagnetic interference blocking device of claim 1, further comprising:
   a fixing part coupled to the first body for maintaining a position of the first body on the circuit board.

3. The electromagnetic interference blocking device of claim 2, further comprising:
   a stabilizer coupled to the first body via the fixing part.

4. The electromagnetic interference blocking device of claim 3, further comprising:
   an upper guide coupled to the first body via the stabilizer and the fixing part.

5. The electromagnetic interference blocking device of claim 4, wherein the upper guide, the stabilizer, the fixing part and the first body are coupled together in order by an insertable connecting device that penetrates the upper guide.

6. The electromagnetic interference blocking device of claim 5, wherein the insertable connecting device comprises a bolt.

7. The electromagnetic interference blocking device of claim 5, further comprising:
   a second body configured to be inserted into another slot formed in the surface of the circuit board, wherein the upper guide is coupled with the first body and the second body.

8. A circuit assembly, comprising:
a circuit board having a top surface, a plurality of transmission lines being formed on the top surface and a slot being formed in the top surface between the two adjacent transmission lines of the plurality of transmission lines; and
an electromagnetic interference blocking device configured to be inserted into the slot for blocking electromagnetic interferences between the two adjacent transmission lines.

9. The circuit assembly of claim 8, wherein the electromagnetic interference blocking device comprises a body having a comb shaped bottom portion insertable within the slot.

10. The circuit assembly of claim 9, wherein the electromagnetic interference blocking device further comprises a fixing part coupled to the body for maintaining a position of the body on the circuit board.

11. The circuit assembly of claim 10, wherein the electromagnetic interference blocking device further comprises a stabilizer coupled to the body via the fixing part for adjusting a height of the electromagnetic interference blocking device.

12. The circuit assembly of claim 11, wherein the electromagnetic interference blocking device further comprises an upper guide for coupling the stabilizer, the fixing part and the body to the circuit board.

13. The circuit assembly of claim 12, wherein the upper guide, the stabilizer, the fixing part and the body are coupled together by a bolt that penetrates each of the upper guide, the stabilizer, the fixing part and the body via corresponding through holes.

14. The circuit assembly of claim 12, wherein the stabilizer 450 serves as a buffer between the upper guide and the fixing part.

15. The circuit assembly of claim 12, wherein another slot is formed in the top surface of the circuit board between two adjacent transmission lines of the plurality of transmission lines, wherein the electromagnetic interference blocking device further includes another body to be inserted into the other slot.

16. The circuit assembly of claim 15, wherein the other body comprises a comb shaped bottom portion insertable within the other slot.

17. The circuit assembly of claim 15, wherein the upper guide is coupled with the other body in addition to the body.

18. The circuit assembly of claim 9, wherein the electromagnetic interference blocking device comprises a conductive material and extends through the circuit board to connect to ground via a conductor on a bottom surface of the circuit board.

19. The circuit assembly of claim 9, wherein the comb shaped bottom portion of the electromagnetic interference blocking device fits tightly within the slot to enable mounting without use of bonding material.

20. An electromagnetic interference blocking device for blocking electromagnetic interference between transmission lines formed on a surface of a circuit board, the electromagnetic interference blocking device comprising:
a first body configured to be inserted into a first slot formed in the surface of the circuit board between a first transmission line and a second transmission line adjacent to the first transmission line, the first body comprising a bottom portion having a comb shape insertable within the first slot;
a second body configured to be inserted into a second slot formed in the surface of the circuit board between the second transmission line and a third transmission line adjacent to the second transmission line, the second body comprising a bottom portion having a comb shape insertable within the second slot; and
a upper guide coupled to the first and second bodies for maintaining locations of the first and second bodies.

* * * * *